United States Patent [19]

Keefe et al.

[11] 4,142,250
[45] Feb. 27, 1979

[54] BUBBLE TRANSLATION SWITCH USING MAGNETIC CHARGED WALL

[75] Inventors: George E. Keefe, Montrose; Yeong S. Lin, Mt. Kisco, both of N.Y.

[73] Assignee: International Business Machines Corporation, Armonk, N.Y.

[21] Appl. No.: 755,897

[22] Filed: Dec. 30, 1976

[51] Int. Cl.² ............................................. G11C 19/08
[52] U.S. Cl. ...................................... 365/36; 365/15; 365/39
[58] Field of Search ................... 340/174 TF; 365/15, 365/29, 36, 41

[56] References Cited

U.S. PATENT DOCUMENTS

| | | | |
|---|---|---|---|
| 3,967,002 | 6/1976 | Almasi et al. | 340/174 TF |
| 4,040,019 | 8/1977 | Bullock | 365/36 |
| 4,070,659 | 1/1978 | Giess et al. | 365/36 |

OTHER PUBLICATIONS

AIP Conference Magnetism & Magnetic Materials – Dec. 3-6, 1974; San Francisco, Cal. pp. 630-632.

Primary Examiner—James W. Moffitt
Attorney, Agent, or Firm—Jackson E. Stanland

[57] ABSTRACT

A switch for transferring magnetic bubble domains from one propagation path to another using a magnetic charged wall is described. The magnetic charged wall bridges the two propagation paths and causes the domain to strip out along the charged wall. By pulsing an overlying conductor, the charged wall and the associated strip domain will shrink away from one side of the conductor in order to translate the domain to the other side. In contrast with previous transfer gates using current carrying conductors where the magnetic field produced by current through the conductors served as the major bubble translational force, the present switch utilizes a magnetic charged wall as the driving source, the current through the conductor being used only for modification of the charged wall. Therefore, the switching margins are maximized to be substantially the same as the bubble propagation margins and the switching currents required are reduced from those in previously used transfer gates. The present switch is particularly useful as a transfer gate in a major/minor loop memory which is fabricated using ion implanted propagation patterns. Various propagation element geometries can be used to provide the bridging charged wall.

31 Claims, 11 Drawing Figures

BUBBLE TRANSLATION SWITCH USING MAGNETIC CHARGED WALL

BACKGROUND OF THE INVENTION

1. Field of the Invention

This invention relates to improved transfer gates for transferring magnetic bubble domains selectively between different propagation paths, and more particularly to an improved transfer gate using a magnetic charged wall which bridges the propagation

2. Description of the Prior Art

In the magnetic bubble domain art, it is known to use ion implantation to produce contiguous propagation elements along which magnetic bubble domains move as a magnetic field reorients in the plane of the magnetic medium. Such a technique is shown in U.S. Pat. No. 3,828,329. Further work with high density contiguous structures (such as discs) and particularly techniques for producing such structures are shown in U.S. Pat. No. 3,967,002, which is assigned to the present assignee. Still another application which describes an improved process for making contiguous disk bubble storage devices is copending application Ser. No. 645,975, filed Dec. 31, 1975 and now abandoned, in the name of G. E. Keefe, and also assigned to the present assignee. This copending application is specifically directed to a technique for making submicron contiguous disk devices using ion implanted structures, where only two masking steps are required to make a complete memory.

In most bubble domain memory organizations, and particularly in the well known major/minor loop organization, a transfer switch is required for transferring bubble domains from one propagation path to another. Where contiguous propagation elements are used for the major and minor loops, the transfer switch is typically a wide conductor bridging the major loop propagation path and the various minor loop propagation paths. However, wide conductors, and other types of transfer gates, do not have transfer margins which are as great as the margins obtained for bubble propagation along a shift register. Since the operating margin of the complete memory depends upon the operating margins of its individual components, the transfer gate operation is a very critical one.

The wide conductor transfer gates known in the art carry current which provides a gradient field that is used to switch the bubble back and forth between the major and minor loops. The major loop propagation path is separated sufficiently far from the minor loop propagation paths so that independent propagation can be obtained in each of them. For this reason, the transfer conductor is generally wider than that which is dictated by the high density lithography limitations in the memory. This means that the absolute value of the magnetic field produced by current in the wide conductor at the edges of the conductor is often larger than the gradient field required to move bubble domains. Consequently, the bias field margin which the bubbles can tolerate is lessened due to the rather large magnetic fields produced at the edge of this conductor when current passes through it. These fields are often large enough to collapse the bubble before it could be moved by the gradient field of the conductor.

In order to overcome the disadvantages associated with prior art transfer switches, and particularly those used to transfer bubble domains between major and minor loops in a high density, contiguous element structure, an improved transfer switch has been designed. This improved transfer switch does not use a conductor or a magnetic overlay element to provide the major translational force for the bubble transfer operation. Rather, a magnetic charged wall is used as the primary driving force, and current through an associated conductor is used merely to modify the intensity of the magnetic charged wall. In this manner, the operating margin of the transfer switch is improved and the switching currents exhibit reduced amplitudes. As will be more fully apparent, the transfer switches of the present application utilize the physics of magnetic bubble technology in a natural way in order to provide a transfer switch which operates effectively without stringent lithography requirements.

Accordingly, it is a primary object of the present invention to provide a more efficient transfer switch for moving bubble domains between different propagation paths.

It is another object of the present invention to provide an improved bubble domain transfer switch which requires less current for transfer than previous switches.

It is still another object of this invention to provide an improved transfer switch for transferring bubble domains selectively between different contiguous element propagation paths.

It is a further object of the present invention to provide a transfer switch for moving magnetic bubble domains between selected propagation paths, where the switch utilizes the naturally occurring features of magnetic bubble technology.

It is a still further object of the present invention to provide a switch for transferring bubble domains between two propagation paths where the switch does not require difficult mask alignment to fabricate.

It is another object of the present invention to provide an improved switch for movement of very small magnetic bubble domains between selected propagation paths in high density contiguous element structures.

It is another object of this invention to provide an improved bubble domain transfer switch which is effective over a wide range of orientations of a reorienting magnetic field used to move the bubble domains.

BRIEF SUMMARY OF THE INVENTION

The transfer switches of this invention are characterized by the presence of a magnetic charged wall which substantially bridges the propagation structures between which bubble transfer occurs. In selected embodiments, the propagation paths are comprised of contiguous elements, such as discs or the like, although the propagation elements need not be contiguous to one another. The elements in each propagation path have a geometry and are aligned with respect to selected elements of the other propagation path so that a magnetic charged wall will bridge the gap between selected elements in the two propagation paths. As the magnetic field used to move the bubble domains reorients in the plane of the bubble medium, a charged wall bridging the gap between the propagation paths will be created and a bubble domain close to the charged wall will strip out along the wall. At this time, a magnetic field is used to shrink the charged wall and the associated stripe domain toward one or the other of the propagation paths. Conveniently, this magnetic field is provided by a conductor generally overlying the bridging charged wall.

Various geometries can be used for the propagation elements in each propagation path, as well as for the conductors used to modify the bridging charged wall. Further, current in the conductor can be used to extend charged walls associated with each of the propagation paths so that these walls substantially meet to provide the bridging charged wall between the two propagation paths. Still further, other means can be used to provide the magnetic field which modifies the bridging charged wall used for bubble domain transfer. All of these variations are within the skill of the art, and are included in the general principle that bubble domain transfer is selectively provided using a magnetic charged wall as the primary force for transferring a bubble domain from one propagation path to another.

These and other objects, features, and advantages will be apparent from the following more particular description of the preferred embodiments.

BRIEF DESCRIPTION OF THE DRAWINGS

FIG. 2A is a cross-sectional illustration of an ion implanted magnetic layer, while

DETAILED DESCRIPTION OF THE PREFERRED EMBODIMENTS

In this invention, charged walls will be used to move magnetic domains along propagation elements which can be contiguous elements. Further, the magnetic charged wall will be utilized as a bridge between different propagation patterns to achieve transfer of domains from one propagation pattern to another. Thus, the magnetic material chosen for the bubble material (or for the drive material used to move bubble domains in a storage layer) is one in which magnetic charged walls can be formed and which will provide substantial flux matching of the flux of the charged wall to the magnetic flux from the bubble, so that efficient propagation will occur.

FIG. 1

Figure 1:
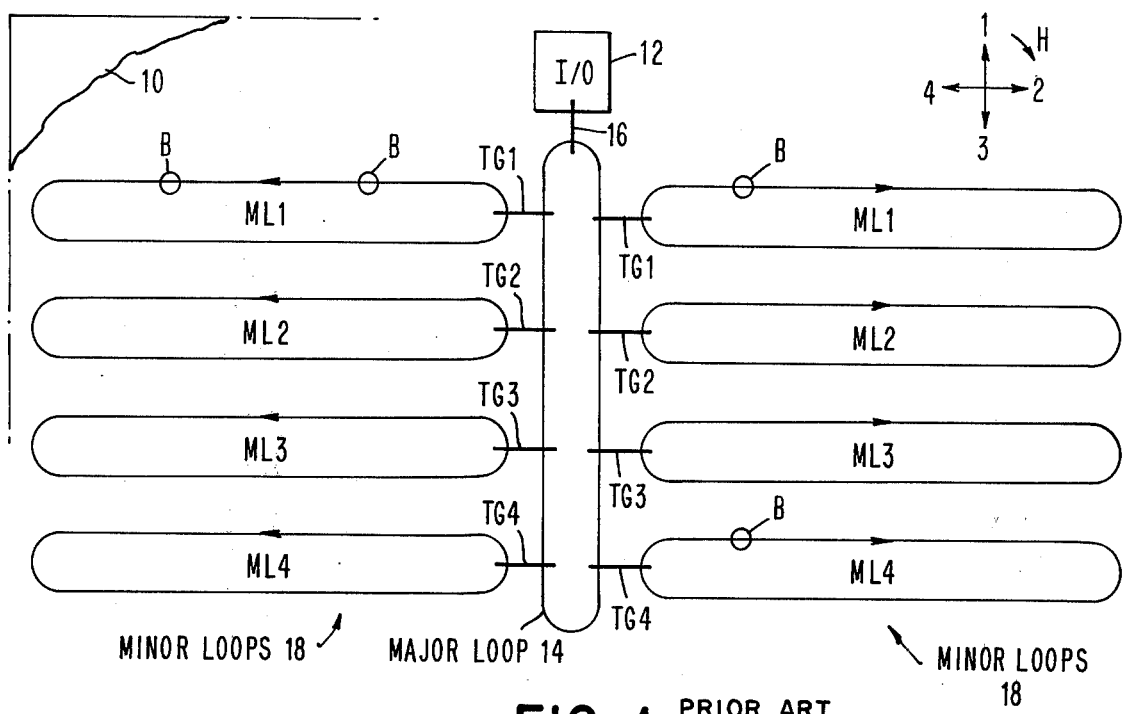
FIG. 1 is a schematic illustration of a major/minor loop bubble domain memory, as is known in the art.

FIG. 1 shows a major/minor loop memory organization of the type well known in the art. In more detail, a bubble domain material 10 supports stable magnetic bubble domains B which can be coded to represent information. These domains are created in the input /output (I/O) circuit 12 and are transferred to a major loop 14 across the transfer gate 16. Once the domains are in the major loop 14, they continually recirculate around this loop as the magnetic field H reorients in the plane of medium 10. This information can be transferred into the minor loops 18 using the transfer gates TG1, TG2, TG3, and TG4. These transfer gates bridge the various minor loops ML1, ML2, ML3, ML4, and the major loop 14, and are used for transferring information back and forth between the major loop and the various minor loops.

This type of memory organization and others similar to it are well known in the prior art. The present invention is directed to improved transfer gates which can be used in this type of memory organization.

Figure 2A:
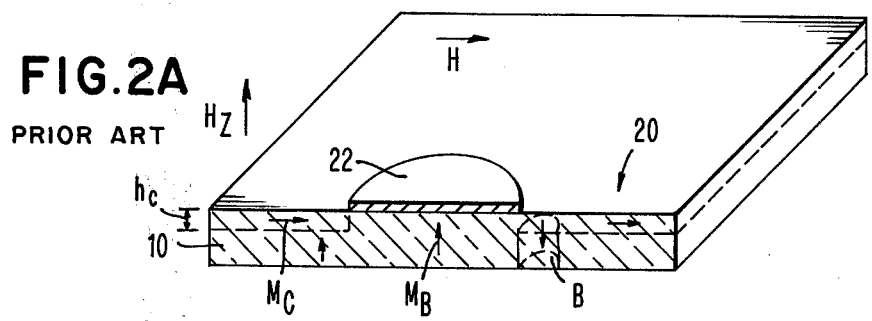
Figure 2B:
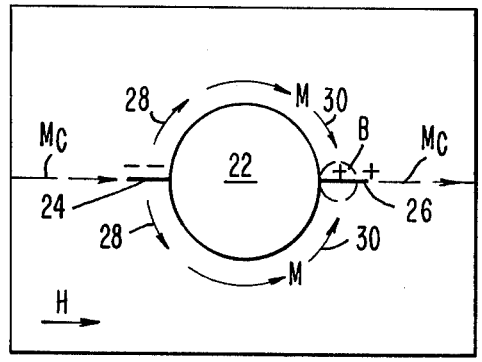
FIG. 2B is a top view of the structure of FIG. 2A, where these figures illustrate the formation of a charged wall and the location of a bubble domain with respect to the charged wall.

THEORY OF CHARGED MAGNETIC WALLS (FIGS. 2A and 2B)

FIG. 2A is a cross-sectional view of a magnetic bubble domain material 10 which has been ion implanted in the surface regions 20 surrounding the ion implantation mask 22. Mask 22 is comprised of a material which will prevent the bombardment of the bubble material 10 by the incoming ions and could be, for instance, a layer of gold. The magnetization $M_B$ of the bubble material is normal to the film plane, while the magnetization $M_c$ of the ion implanted areas is in the plane of layer 10. For purposes of illustration, a bubble domain B is shown in layer 10. The magnetic field H used to drive domains is directed to the right in this drawing (i.e., at the instant of time represented by this figure).

FIG. 2B shows the magnetization direction in the ion implanted region 20 when magnetic field H is applied in the direction indicated. The magnetization $M_c$ diverges and flows around the nonimplanted region of the bubble material under mask 22 in a manner similar to that of a slow stream of water flowing around a boulder in the stream. This forms a diverging wall 24 upstream and a converging wall 26 downstream. That is, the magnetization vectors 28 are directed oppositely to each other to form the divergent wall, while the magnetization vectors 30 are directed toward one another to form the converging wall 26. In accordance with the reference standard chosen, the converging wall is indicated by the plus (+) signs.

For bubble domains with down magnetization as indicated in FIG. 2A, the plus charged wall 26 is attractive to them. This converging wall has magnetic flux associated with it which is directed downwardly in a direction parallel to the magnetization of the bubble domain. Therefore, it is energetically attractive for the bubble domains and the bubble domain will stay at the charged wall to which it is coupled. Of course, if the magnetization of the bubble domain were in the opposite direction (up) then the bubble domain would be attracted to and coupled to the divergent wall 24.

Charged walls of this type have been used to move magnetic bubble domains around propagation elements, in response to the reorientation of the drive field H in the plane of the magnetic medium. In this type of propagation, the charged wall moves around the propagation element and the bubble domain attaches itself to the charged wall and moves along with it. This type of bubble domain propagation is described in copending application Ser. No. 645,737 (Giess et al), filed Dec. 31, 1975, now U.S. Pat. No. 4,070,658 and assigned to the present assignee. This type of propagation is also described in a paper by G. S. Almasi et al entitled "Bubble Domain Propagation Mechanisms in Ion Implanted Structures," presented at the 20th Annual Conference on Magnetism and Magnetic Materials, December 1974, at San Francisco, Calif. This paper has been published in the Proceedings of that conference.

In order to have efficient propagation of bubble domains using charged walls, it is desirable that there be substantial flux matching between the bubble domain flux $\phi_B$ and the magnetic flux $\phi_{CW}$ associated with the charged wall that is interacting with the bubble domain B. Although it is desirable to have the ratio $\phi_B/\phi_{CW} \simeq 1$ for maximum flux matching, this ratio can vary from about 1 to about 10 with good results.

The magnetic flux $\phi_B$ of the bubble domain depends upon the bubble domain diameter d and the magnetization $M_B$ of the bubble domain. The flux $\phi_{CW}$ depends on the magnetization $M_c$ in the implanted drive layer, and the thickness $h_c$ of the implanted layer. Thus, it can be appreciated that the flux $\phi_{CW}$ can be set to a given value by adjusting these parameters, and particularly the magnetization $M_c$ of the implanted material and the depth $h_c$ of implantation. These quantities are adjusted so that the flux associated with the charged wall is sufficient to drive the magnetic bubble domain as the in-plane field H reorients. In particular, for small magnetic bubble domains, the properties of the implanted region are adjusted to provide sufficient flux $\phi_{CW}$ for flux matching. As taught in aforementioned Ser. No. 645,737, it may be desirable to use a separate drive layer which is easily implanted, for movement of bubble domains in a separate storage layer. Further, the drive layer can be a continuous sheet of magnetically soft material, such as NiFe, which has apertures in it for defining the propagation elements (however, this is not as suitable for bubble domain propagation). In this case, the charged wall would be formed in the NiFe overlayer in the same manner that the implanted regions 20 were provided in FIG. 2A.

Thus, bubble propagation in ion implanted structures relies on the movement of magnetic charged walls in response to the reorientation of the in-plane drive field H. For bubble domains having the magnetization shown in FIG. 2A, the converging walls are attractive to the bubble domains. These bubble domains follow the charged walls as the walls move around the periphery of the ion implanted regions. For contiguous disk ion implanted structures, the charged walls at the wide parts of the propagation pattern move to the narrower parts (the cusps) and disappear, only to reappear on the other side of the propagation track 180° later. A 360° rotation of the field H completes one propagation step although the bubbles B spend most of that time in the cusp. This explains why the bubble is not repelled from the cusp after it arrives there.

The propagation of bubbles by ion implanted regions having in-plane magnetization requires that the in-plane magnetic field H should be strong enough to switch the magnetization of the implanted layer. In order to reorient the magnetization in the implanted layer, the field H must have an amplitude sufficient to overcome the effective cubic anisotropy field in the implanted regions.

Figure 3:
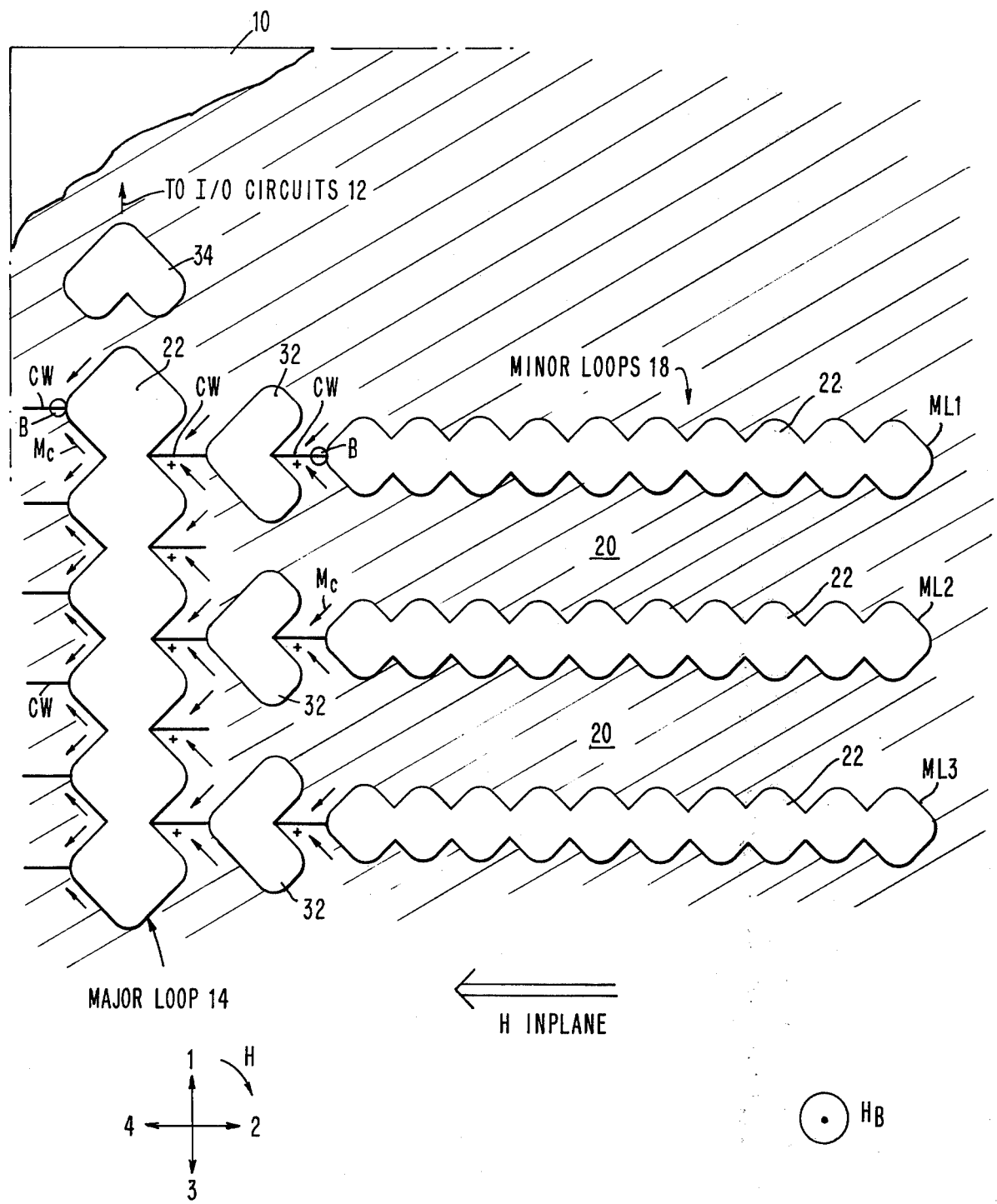
FIG. 3 is an illustration of the propagation elements for major and minor loops of a bubble domain memory, specifically showing the formation of bridging charged walls between the major loop and the various minor loops, for one direction of the in-plane drive field H.
Figure 4:
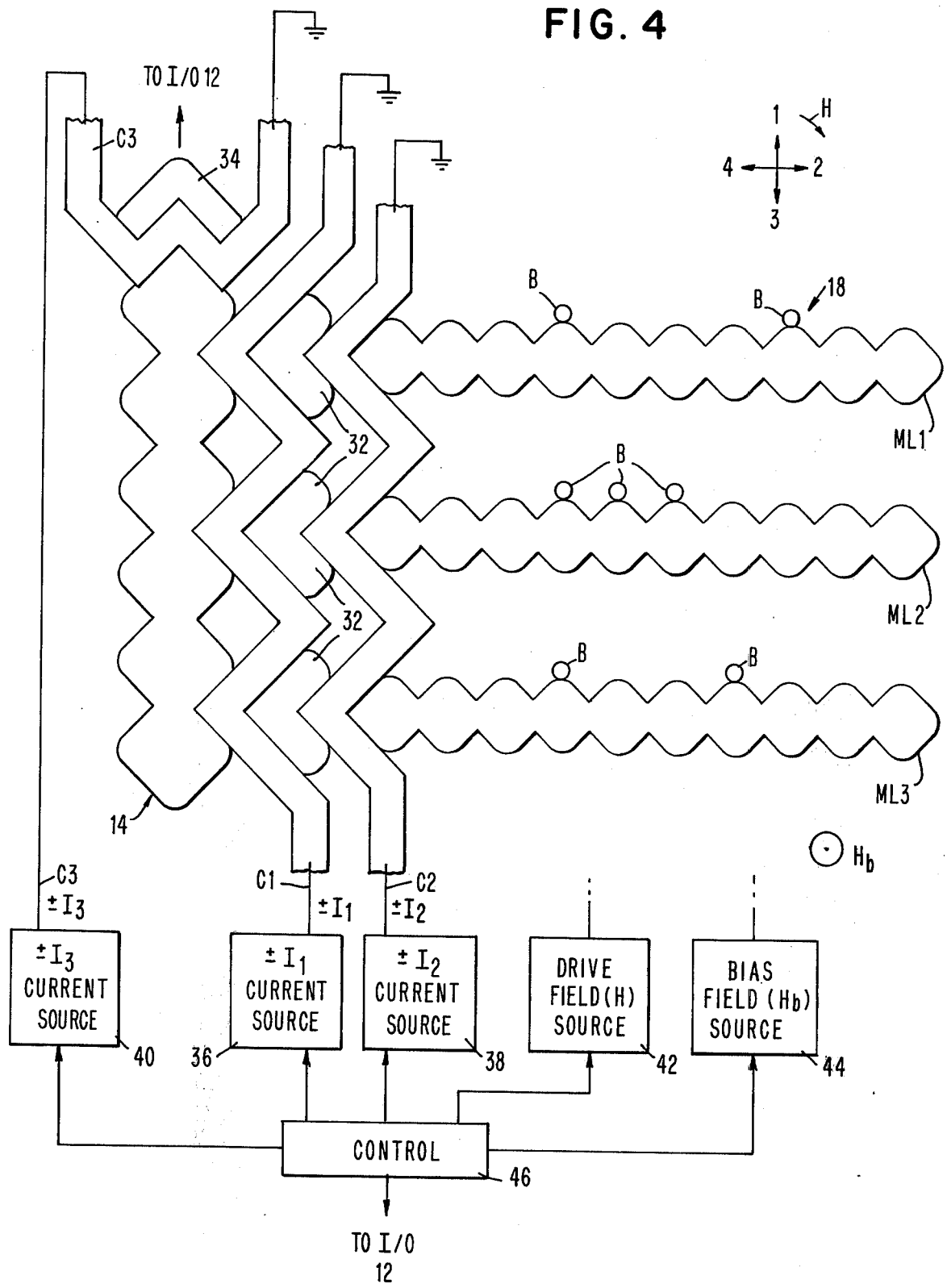
FIG. 4 is an illustration of the circuitry required to transfer bubble domains back and forth between the major loop and the minor loops, using bridging charged walls between the major loop and the various minor loops.

FIGS. 3 and 4

These figures show contiguous structures for movement of magnetic bubble domains in response to the reorientation of field H. Following the reference notations used in the previous FIGS., the surface regions 20 of the bubble material 10 have been ion implanted as is indicated by the cross-hatching in this drawing. The major loop 14 extends in a vertical direction while the various minor loops 18 (only three of which are shown) extend in a horizontal direction. As field H reorients, magnetic bubble domains B move around the edges of the ion implanted regions. In this top view, the masking layer 22 is shown, it being understood that the surface portions of magnetic medium 10 directly below this masking layer are not ion implanted.

In FIG. 3, the major loop 14 and the minor loops 18 are comprised of contiguous propagation elements generally having a diamond shape. It should be understood that the propagation elements need not be contiguous to one another and need not have a diamond shape. As one alternative, the propagation elements can be generally circular disks as taught in the prior art.

Located between each of the minor loops 18 and the major loop 14 is an isolation element 32. As will be appreciated later, the isolation elements 32 provide an intermediate propagation position in order to isolate the major loop from the various minor loops. In the same manner, an isolation element 34 is located between major loop 14 and I/O circuits 12.

In FIG. 3, the direction of magnetization $M_c$ in implanted regions 20 is indicated by the arrows labeled $M_c$ while the charged walls are indicated by the heavy lines CW. The charged walls and magnetization $M_c$ are shown for an orientation of field H to the left (orientation 4).

From this drawing, it is clear that there are charged walls CW bridging the major loop 14 and the isolation elements 32. Further, there is a charged wall bridging each of the isolation elements 32 and the associated minor loop 18. These bridging charged walls are the walls which are used for bubble transfer between the major loop 14 and the minor loops 18.

FIG. 4 shows the structure used to transfer bubble domains back and forth between major loop 14 and the minor loops 18, and also the structure used to transfer bubble domains back and forth between major loop 14 and I/O circuits 12. For ease of illustration, the cross-hatching indicating the ion implanted regions 20 is not shown in this drawing or in succeeding drawings.

The transfer gates for transferring bubble domains between major loop 14 and the minor loops 18 are comprised of conductors C1 and C2, and the current sources 36 and 38, which are connected to C1 and C2, respectively. Conductor C1 is located between major loop 14 and each of the isolation elements 32, while conductor C2 is located between the isolation elements 32 and the minor loops 18.

The transfer gate located between major loop 14 and the I/O circuits 12 is comprised of the isolation element 34 and the conductor C3. Conductor C3 is connected to a current source 40.

Current sources 36, 38 and 40 provide currents $I_1$, $I_2$, and $I_3$, respectively, in the connected conductors in either plus or minus polarity.

A drive field source 42 provides the reorienting in-plane field H while a bias field source 44 provides the field $H_b$ used to generally stabilize the size of the bubble domains B.

A control circuit 46 provides control signals to the current sources 36, 38, and 40, and to the magnetic field sources 42 and 44. Control 46 also provides synchronization pulses to the I/O circuit 12. The function of control 46 is to properly synchronize the operation of the various current sources, the I/O circuit, and the magnetic field sources. It provides proper clocking and triggering pulses for the various components associated with the memory so that the functions of write, read, propagate, transfer, and annihilate can occur at the proper times.

OPERATION OF TRANSFER SWITCH (FIGS. 5A-5C)

Figure 5A:
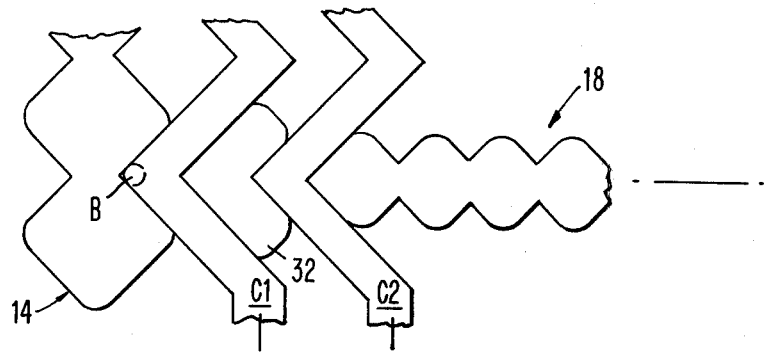
FIGS. 5A–5C illustrate in detail the transfer operation between the major loop and one of the minor loops, using the structure of FIG. 4.

In these figures, only a portion of the circuitry shown in FIG. 4 is illustrated, for ease of illustration. Thus, these figures are used to indicate the principles of transfer of a bubble domain from the major loop 14 to one of the minor loops 18. In particular, FIG. 5A shows a domain B located on the major loop. This domain is to be transferred toward the minor loop 18.

Figure 5B:
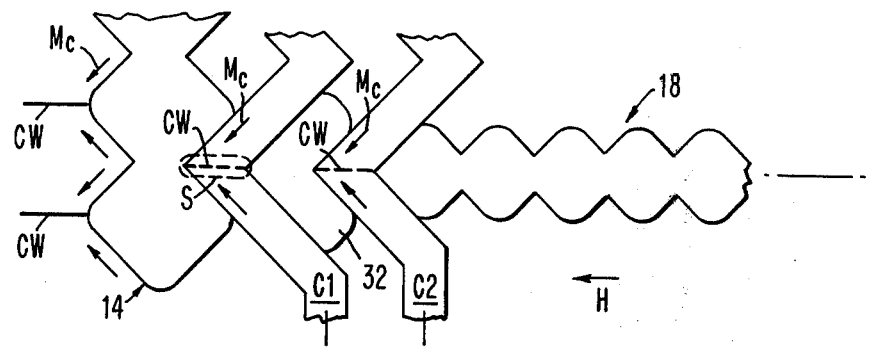

In FIG. 5B, the in-plane field H is directed to the left as shown. The arrows indicate the magnetization $M_c$ in the ion implanted region 20 of the magnetic material, while the heavy dashed lines are the charged walls CW. When field H is directed to the left, a magnetic charged wall CW substantially bridges the gap between major loop 14 and isolation element 32. This causes the domain to stripe-out along the charged wall to form the stripe S indicated by the dashed line.

Figure 5C:
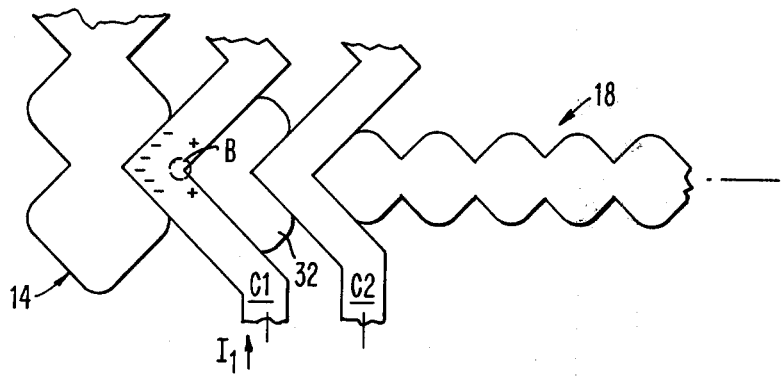

If an appropriately directed current $I_1$ is sent along conductor C1, as shown in FIG. 5C, the field produced by this current will tend to repel the stripe from the left side of C1 (as indicated by the minus signs) and will tend to attract the stripe S to the right-hand side (as indicated by the plus signs). Thus, the field produced by current $I_1$ modifies the intensity of the bridging charged wall so that the wall will shrink away from the major loop toward the isolation element 32. The stripe S will shrink with it, thus translating the bubble from the major loop 14 to the isolation element 32. The field H was directed toward the left when this began occurring but can be continuing toward a new orientation. Thus, the current pulse $I_1$ can be applied between H field orientation 4 and orientation 2 (FIG. 4). In this switch, the window for effective transfer in terms of the rotation of field H, is larger than that with other types of transfer switches. This means that the criticality of timing of the transfer current pulse at particular orientations of the drive field is not as great as it is with respect to other types of switches. Generally, 60°-90° of the 360° rotation cycle of H can be used for application of the transfer current. Of course, as the rotation frequency of H increases, this advantage becomes more important.

After this, field H continues to rotate and bubble B will move to the cusp region of element 32. When it is at the cusp, the same type of transfer cycle occurs to create a bridging charged wall between element 32 and the minor loop 18. When the bubble stripes out across this charged wall, an appropriately directed current $I_2$ is sent through conductor C2 to cause the charged wall and the bubble to shrink away from isolation element 32 toward minor loop 18. This operation is identical to that described for transfer between the major loop and the isolation element 32 and therefore will not be shown in more detail.

It should be noted that the isolation element 32 is used as an intermediate register between major loop 14 and minor loop 18. This insures that the propagation paths defined by the major loop and the minor loops are isolated from one another. Further, use of two conductors C1 and C2 provides independent control of the bubble domains in the major loop and in the minor loops 18. As will be later seen, alternatives exist wherein the intermediate element 32 is not required.

In the operation of the transfer gate of FIG. 4, a bridging charged wall was formed between the major loop and the isolation element, and then a current pulse of appropriate polarity was applied to shrink the wall in the desired direction. However, an alternative mode of operation can be used in which a current pulse of appropriate polarity is present in conductor C1 prior to formation of the bridging charged wall. In this situation, the current pulse sets up a magnetic field which impedes formation of the bridging charged wall so that a domain on either the major loop 14 or the heart-shaped isolation element 32 will not stripe-out.

In the transfer gate of FIG. 4, the gap between the major loop 14 and the isolation element 32, as well as the gap between element 32 and the minor loops 18, is approximately four times the bubble diameter. This spacing should be such that a bridging charged wall is formed between the elements 14, 32, and 18 at the proper value of in-plane field H. The conductors C1 and C2 have a width of approximately four and one-half times the bubble diameter. This insures that they slightly overlap the propagation elements in order to affect both ends of the bridging charged wall. Generally, the contiguous propagation elements forming the major loop and the various minor loops have dimensions such that bubble domains moving along the edges of these elements will be spaced by about 4 bubble diameters. Therefore, each of the edges of the diamond-shaped contiguous elements are approximately four bubble diameters in length. As will be apparent to those skilled in the art, these dimensions can be varied somewhat.

The isolation element 32 is a heart-shaped element capable of holding two bubble domain bits simultaneously. For example, bits can be located at the tip of element 32 and also in the cusp of element 32 at the same time. Consequently, the distance between the tip of this element and its cusp is about four bubble diameters. The transfer gate separating major loop 14 and isolation element 34 operates in a similar fashion, and will not be described in more detail.

ALTERNATIVE GEOMETRIES (FIGS. 6, 7 AND 8)

These figures illustrate alternative geometries which can be used to move magnetic bubble domains from one propagation path to another using a bridging charged wall in the gap between the propagation paths. These figures illustrate only a portion of the overall memory organization structure, for ease of illustration. As in previous embodiments, the regions around the propagation elements are ion implanted, as in the region in the gap between the different propagation elements. The same reference numerals are used whenever possible to indicate elements having the same functions as those described with respect to the transfer gate of FIG. 4.

Figure 6:
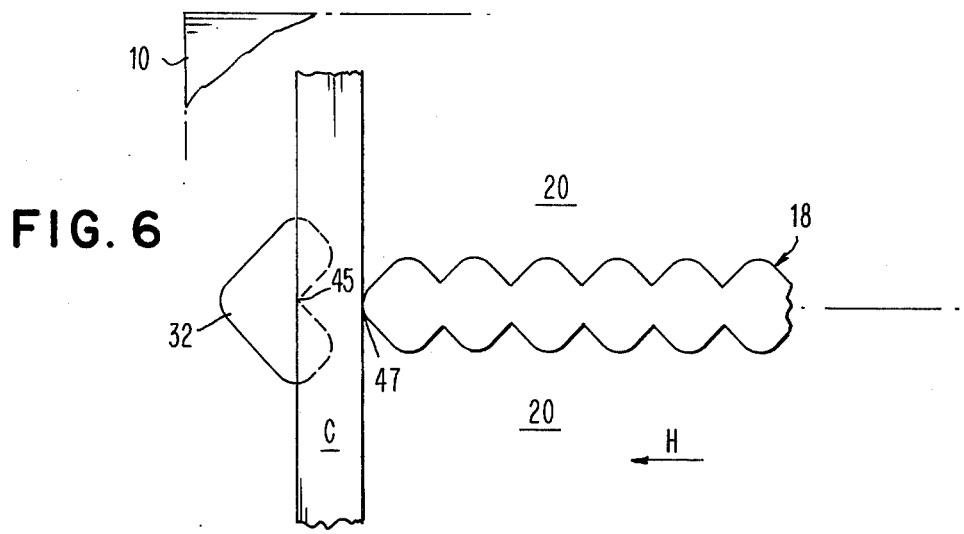
FIGS. 6, 7 and 8 illustrate various alternative designs for transfer gates utilizing the principles of the present invention.

In FIG. 6, a heart-shaped isolation element 32 is separated from a contiguous element propagation structure which could be one of the minor loops 18. Portions 20 of the surface of bubble material 10 (or a separate drive layer) are ion implanted. A conductor C bridges the gap between element 32 and minor loop 18. Conductor C is used to modify the bridging charged wall which will form between the cusp 45 of element 32 and the tip 47 of minor loop 18. This bridging charged wall will form when the magnetic field H is directed to the left as was described with respect to to FIGS. 5A-5C.

The transfer gate of FIG. 6 has dimensions similar to those of the gate of FIG. 4, except that the conductor C extends in a straight line rather than in a zig-zag geometry. Thus, the gap between cusp 45 and tip 47 is approximately four bubble diameters. The conductor C has a width of approximately 4½ bubble diameters.

In operation, a bridging charged wall joins cusp 45 and tip 47 of minor loop 18 when the magnetic field H is directed to the left. At this time, an appropriate current pulse in conductor C will cause this charged wall, and any stripe domain along it, to shrink in the desired direction. Thus, the charged wall and its associated stripe can shrink either toward minor loop 18 or toward the isolation element 32, depending upon whether it is desired to transfer the bubble domain from element 32 to minor loop 18, or vice versa.

Figure 7:
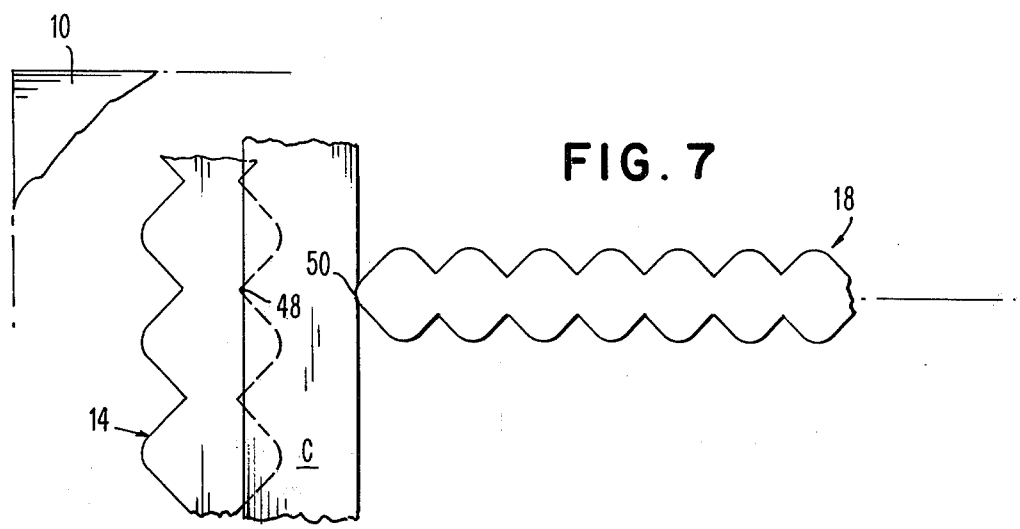

The transfer gate of FIG. 7 can be used to transfer bubble domains between the major loop 14 and the minor loops 18, only one of which is shown in this figure. The gate of FIG. 7 is similar to that shown previously, except that a larger gap exists between the major loop 14 and the minor loop 18. In this gate, the gap is approximately 7 bubble diameters while the conductor C has a width of approximately 12 bubble diameters. The dimensions of the major loop propagation elements and the minor loop propagation elements are those stated previously with respect to the structure of FIG. 4.

Although the gate of FIG. 7 will provide transfer between the cusp 48 of major loop 14 and the tip 50 of minor loop 18, this transfer is not as efficient for small bubble domains as are the other designs described herein. While transfer from the tip 50 to the cusp 48 is readily achieved, a larger current is required to transfer bubble domains from the cusp 48 to the tip 50 of the minor loop. The reason for this is that it is generally more difficult to remove a bubble domain from a cusp than from a tip portion of the propagation elements and this, coupled with a large separation between the major loop 14 and the minor loop 18, means that a larger current must flow in conductor C to have bubble domain transfer from major loop 14 to minor loop 18. However, the requirement for a larger current increases the possibility of domain collapse at the end of the charged wall nearest major loop 14 prior to shrinkage of this wall toward minor loop 18.

In the gate of FIG. 7, it may be desirable and necessary to increase the depth of ion implantation and/or the magnetization of the implanted material in order to lengthen the charged wall which bridges the gap between major loop 14 and minor loop 18. If desired, an additional drive layer can be used over the magnetic bubble storage layer for implantation in accordance with the principles described in aforementioned copending application Ser. No. 645,737 (U.S. Pat. No. 4,070,658).

The operation of the gate of FIG. 7 is similar to that previously described. That is, a bridging charged wall is formed between cusp 48 and tip 50 when the magnetic field is suitably directed (phase 2 or phase 4). For example, when field H is directed to the left (phase 4), a bubble domain at cusp 48 will stripe-out along the charged wall. If a current flows upwardly in conductor C at this time, the charged wall and the associated stripe domain will shrink toward minor loop 18, to effect transfer of the bubble domain from the major loop to the minor loop (as H rotates from phase 4 to phase 2). For transfer in the reverse direction, a bubble domain at tip 50 will stripe-out along the bridging charged wall produced when field H is in phase 4. An oppositely directed current in conductor C will cause the charged wall and the associated stripe domain to shrink toward the cusp 48, thereby effecting transfer from minor loop 18 to major loop 14.

Figure 8:
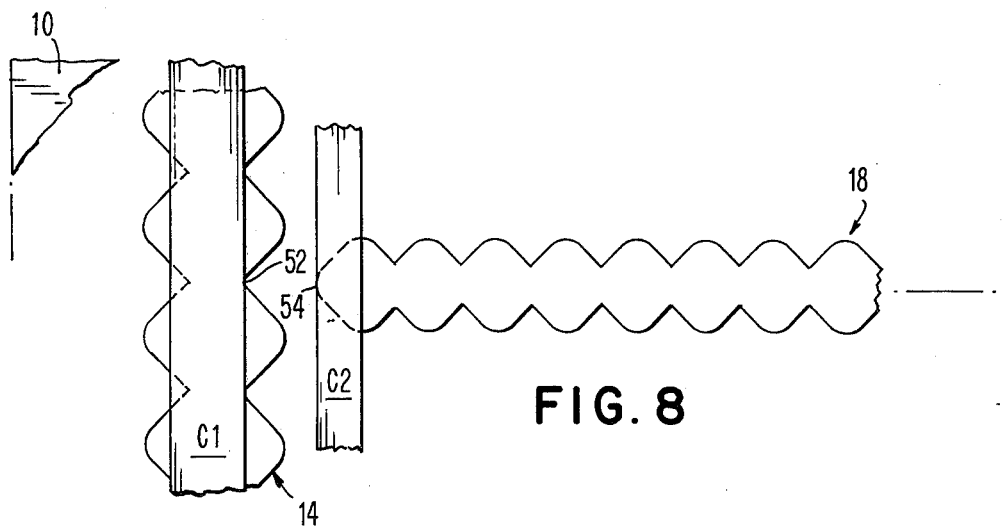

The transfer gate of FIG. 8 utilizes two conductors C1 and C2, where C1 is associated with the major loop 14 and C2 is associated with the minor loop 18. This type of transfer gate is a pulse-to-transfer gate which works successfully without the need for an intermediate position element (such as element 32 of FIG. 4). In this gate, the gap between the cusp 52 of major loop 14 and the tip 54 of minor loop 18 is approximately 4 bubble diameters to isolate propagation in the loops 14 and 18. The width of the conductors C1 and C2 is also approximately 4 - 4½ bubble diameters.

The operation of the gate of FIG. 8 is slightly different from the operation for the previous transfer gates. In this gate, the depth of ion implantation, magnetization of the implanted layer, etc., are chosen so that a charged wall does not completely bridge the gap between cusp 52 and tip 54 when field H is directed to the left. Instead, charged walls grow outwardly from cusp 52 and tip 54, but do not meet at the center of the gap separating the major and minor loop. Generally, the two charged walls are separated by a distance greater than one bubble diameter, to insure that no bubble domain strip-out will occur. Suitably directed current pulses in conductors C1 and C2 will expand the charged walls growing from cusp 52 and tip 54 so that these charged walls will meet and provide a bridging charged wall. When this is done, a bubble domain at cusp 52 or tip 54 will strip-out along the bridging charged wall. At that time, the polarity of current on one of the conductors is reversed to shrink the stripe domain toward the other conductor. For example, if it is desired to transfer a bubble domain from tip 54 to cusp 52, the polarity of current in conductor C2 is reversed. This will exert a pressure on the right-hand side of the stripe domain causing it to shrink to the left to cusp 52. Correspondingly, if instead of changing the polarity of current in C2 the current in conductor C1 is reversed in polarity, the stripe domain will shrink to the right toward tip 54.

Since the currents in C1 and C2 will be in opposite directions in order to create a bridging charged wall, the in-plane components produced by these currents will cancel one another in the region between the major loop 14 and minor loop 18. Therefore, there will be no adverse effect on the propagation due to the reorienting in-plane field H. This will insure that the margins for propagation along the major loop 14 are maintained.

With all of the transfer switches described herein, it should be noted that only localized fields are used to effect transfer, and that these field strengths are quite low. Consequently, bubble domain collapse is minimized and the effect on propagation margins and bias field margins in other portions of the magnetic chip will also be minimal. Since the bias field $H_b$ is affected only slightly and only in the region near the transfer gap, propagation margins and bias field margins in the remainder of the magnetic chip will not be affected.

In the practice of this invention, a charged wall is produced that substantially bridges the gap between the two propagation paths along which transfer is to take place. Generally, this can be achieved by having the edges of the propagation elements on opposite ends of the bridging charged wall be of opposite curvature. For example, the transfer gate of FIG. 8 has a cusp 52 on one end of a bridging charged wall while a tip 54 is on the other end of the bridging charged wall. The curvature of the cusp can be termed concave while the curvature of the tip is convex. However, it should be understood by those of skill in the art, while propagation structures having opposite curvature are easily bridged by a charged wall, variations in curvature may be achieved in the practice of the principles of this invention. Further, it should be understood that various conductor sets can be utilized with differing pulse sequences to achieve more complex types of bubble transfer.

The broad teaching of this invention is the utilization of a charged wall as the primary driving mechanism for transfer of a bubble domain from one propagation path to another, and a magnetic field for modifying the charged wall in order to personalize the direction of transfer. The charged wall need not extend completely across the gap separating the two propagation paths. The charged wall has maximum intensity at the edges of the ion-implanted regions 20 and decreases in intensity with distance away from these edges. Thus, a situation may occur where the charged wall has very small (or essentially zero) intensity at the center of the gap between the two propagation elements to be bridged by the charged wall. Even in this situation, efficient transfer can occur.

Generally, as long as the length of the portion of the charged wall having very small intensity is equal to or less than about one bubble diameter, effective transfer will occur. However, the margins of transfer increase if the charged wall bridges the gap with strong intensity throughout its length.

EXAMPLES

The following table illustrates some bubble transfer operations which have been demonstrated using the transfer gates shown in FIGS. 4, 6, and 7. These are just representative values of transfer and it will be noted that this type of transfer gate can be used to switch bubble domains having very small size. The measurements were performed in three different bubble domain samples. In the first sample (A), a single layer bubble domain garnet was ion implanted to provide propagation structures, while in the other two samples (B and C), double garnet layers were utilized. The top garent layer was ion implanted to form propagation elements and acted as a drive layer for bubble domains in the bottom garnet layer.

circuits. The bias field range is slightly (10-20%) smaller than that for propagation. For these examples, the frequency of the rotating drive field H was 300 kHz.

What has been shown is an improved transfer switch for moving magnetic bubble domains between separated propagation paths. The invention uses the principle of a magnetic charged wall bridging these propagation paths where the charged wall provides the major force for transferring domains between the propagation paths. The magnetic field, conveniently provided by a current carrying conductor, is used to modify the bridging charged wall to personalize the direction of transfer.

The principles of the invention having been shown, various alternatives within the scope of this invention will be envisioned by those of skill in the art.

What is claimed is:

1. An apparatus for transferring magnetic bubble domains from a first propagation path to a second propagation path where said first and second propagation paths are separated from one another, comprising:
   means for producing a magnetic charged wall substantially bridging the separation between said first propagation path and said second propagation path,
   means for modifying the intensity of said charged wall to cause stripe-out of said domain along said charged wall to transfer said domain to said second propagation path, and
   means for modifying the intensity of said charged wall to prevent said bubble domain from striping out along said charged wall in order to retain said domain at said first propagation path.

2. The apparatus of claim 1, where said means for modifying is comprised of a conductor located such that current through it will produce a magnetic field intercepting said charged wall.

3. The apparatus of claim 1, wherein said first and second propagation paths are comprised of propagation elements along which bubble domains move in response to the movement of charged walls along said propagation elements.

4. The apparatus of claim 3, where said propagation elements are contiguous to one another.

5. The apparatus of claim 3, where said propagation elements are comprised of ion implanted regions.

6. The apparatus of claim 1, where said propagation paths are separated by about at least four bubble diameters.

7. The apparatus of claim 2, where said conductor

TABLE

| Sample | Bubble Diameter ($\mu$) | Transfer Gate Fig. No. | Conductor Width ($\mu$m) | Transfer Gap ($\mu$m) | Transfer Current (mA) | Bias Field Range Oe |
|---|---|---|---|---|---|---|
| A. GdYTm garnet 4.5 microns thick | 5 | 6 | 20 | 16 | 20-40 | 90-96 |
| B. GdYTm garnet (drive layer) on EuTm garnet (storage layer) thickness ratio drive/ storage was 0.41 microns/ 1.19 microns | 1 | 4 | 4.5 | 4 | 50 | 405-430 |
|  |  | 7 | 10 | 7 | 150 | 410-425 |
| C. GdYTm garnet (drive layer) on EuTm garnet (storage layer) thickness ratio drive/ storage was 0.3 microns/ 0.96 microns | 1 | 4 | 4.5 | 4 | 40-65 | 365-400 |

Typically, a (40-70) mA current pulse of about 1 microsecond duration is sufficient to facilitate bubble transfer using a 4.5 micron wide conductor atop a 4 micron gap separating two orthogonal propagation generally overlies the separation between said first and second propagation paths.

8. The apparatus of claim 1, where said first propagation path is a major loop for input/output functions and said second propagation path is a minor loop for storage of information in a major/minor loop bubble domain memory.

9. A method for transferring a bubble domain from a first propagation path to a second propagation path sufficiently separated from said first propagation path that bubble domains travelling in either propagation path will not spontaneously transfer to the other propagation path, comprising:
forming a magnetic charged wall which extends substantially from said first propagation path to said second propagation path,
expanding a bubble domain at said first propagation path and increasing the intensity of said charged wall sufficiently that said bubble domain will expand along said charged wall in a direction toward said second propagation path, and
shrinking said bubble domain and said charged wall from said first propagation path to said second propagation path.

10. The method of claim 9, where said shrinking includes the step of applying a magnetic field in a direction to shrink said charged wall.

11. The method of claim 9, where said magnetic charged wall is at least about four bubble domain diameters in length.

12. An apparatus for transferring magnetic bubble domains from one register to another, comprising:
a magnetic medium in which said bubble domains can move in response to the reorientation of a magnetic drive field,
first and second shift registers comprised of ion implanted propagation elements along which said bubble domains move as said magnetic field reorients, said first and second shift registers being sufficiently separated from one another that bubble domains in each register will not controllably move to the other register in the absence of a control signal to a transfer means,
transfer means for controllably transferring bubble domains between said first and second shift registers in response to a control signal applied thereto, said transfer means being comprised of means for producing a magnetic charged wall substantially bridging said first and second shift registers and means for modifying the intensity of said charged wall to an amount sufficient to cause stripe-out of said bubble domain along the length of said charged wall, and
control means for applying a control signal to said transfer means.

13. The apparatus of claim 12, where said transfer means is comprised of field means for producing a magnetic field intercepting said charged wall.

14. The apparatus of claim 13, where said field means is comprised of at least one electrical conductor.

15. The apparatus of claim 13, where said field means is comprised of a first electrical conductor generally overlying said first shift register and a second electrical conductor generally overlying said second shift register.

16. The apparatus of claim 12, where said means for producing a magnetic charged wall includes first means for producing a first charged wall extending from said first shift register and a second means for producing a second charged wall extending from said second shift register.

17. The apparatus of claim 16, including means for joining said first and second charged walls.

18. The apparatus of claim 12, where said means for modifying includes magnetic field means for producing a magnetic field intercepting said charged wall to shrink said charged wall.

19. The apparatus of claim 12, where said first and second shift registers are comprised of contiguous propagation elements forming high density storage registers.

20. The apparatus of claim 19, where said first and second registers are separated by at least about four bubble diameters.

21. The apparatus of claim 20, where said first and second registers are substantially orthogonal to each other.

22. An apparatus for transferring bubble domains from a first propagation path to a second propagation path, comprising:
a first propagation path including at least one propagation element having an edge portion of generally concave curvature,
a second propagation path including at least one propagation element having an edge portion of generally convex curvature,
means for producing a magnetic charged wall extending substantially from said concave edge to said convex edge,
means for modifying the intensity of said magnetic charged wall.

23. The apparatus of claim 22, where said first and second propagation paths are comprised of contiguous propagation elements.

24. The apparatus of claim 23, where said elements are the edges of ion implanted regions of a magnetic material.

25. The apparatus of claim 24, where each said edge defines a generally undulating curve.

26. A method for propagating a bubble domain from a first location in a bubble domain medium to a second location in said medium, comprising the steps of:
producing a magnetic charged wall substantially bridging said first and second locations of sufficient intensity along its length to cause said bubble domain to expand along its length from said first position to approximately said second position, and
modifying said charged wall to shrink it and said extended domain toward said second position.

27. The method of claim 26, where said charged wall is shrunk by changing the magnitude of a magnetic field which intercepts said charged wall and is directed substantially normal to the plane of said bubble domain medium.

28. A bubble domain apparatus, comprising:
a magnetic medium in which said bubble domains exist and can be moved,
at least two propagation paths for movement of bubble domains in said medium, said propagation paths being comprised of propagation elements along which said bubble domains move in response to the reorientation of a first magnetic field substantially in the plane of said magnetic medium, at least one of said propagation paths being comprised of contiguous propagation elements,
means for producing a magnetic charged wall between a first position on one of said propagation paths and a second position on the other said propagation path, field means for increasing the intensity of said magnetic charged wall sufficiently to cause stripe-out of a bubble domain along said charged wall from said first position toward said second position, said field means including means for producing a second magnetic field which intercepts said charged wall in a direction substantially normal to the plane of said magnetic bubble medium, wherein said bubble domain is transferred from said first position to said second position.

29. The apparatus of claim 28, where said field means includes at least one electrical conductor overlying one of said propagation paths, current in said electrical conductor producing said second magnetic field which intercepts said magnetic charged wall.

30. The apparatus of claim 28, wherein said propagation elements have geometries such that said magnetic charged walls move along the periphery of said propagation elements as said first magnetic field reorients in the plane of said magnetic medium.

31. The apparatus of claim 28, wherein the curvature of the propagation element containing said first position is substantially opposite to the curvature of the propagation element containing said second position.

* * * * *